US008891789B2

(12) United States Patent
McGrath

(10) Patent No.: US 8,891,789 B2
(45) Date of Patent: *Nov. 18, 2014

(54) ADJUSTING THE LOUDNESS OF AN AUDIO SIGNAL WITH PERCEIVED SPECTRAL BALANCE PRESERVATION

(75) Inventor: David S McGrath, Rose Bay (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 404 days.

This patent is subject to a terminal disclaimer.

(21) Appl. No.: 13/265,693

(22) PCT Filed: Apr. 29, 2010

(86) PCT No.: PCT/US2010/033024
§ 371 (c)(1),
(2), (4) Date: Oct. 21, 2011

(87) PCT Pub. No.: WO2010/129395
PCT Pub. Date: Nov. 11, 2010

(65) Prior Publication Data
US 2012/0170769 A1  Jul. 5, 2012

Related U.S. Application Data

(60) Provisional application No. 61/176,084, filed on May 6, 2009.

(51) Int. Cl.
| H03G 5/00 | (2006.01) |
| H03G 9/18 | (2006.01) |
| H03G 9/02 | (2006.01) |
| H03G 9/00 | (2006.01) |
| G10L 21/02 | (2013.01) |
| H03G 3/00 | (2006.01) |

(52) U.S. Cl.
CPC .............. *H03G 9/18* (2013.01); *G01L 21/0264* (2013.01); *H03G 9/025* (2013.01); *H03G 9/005* (2013.01); *G10L 21/0205* (2013.01)
USPC .......................................... 381/100; 381/104

(58) Field of Classification Search
CPC ...... H03G 5/165; H04R 1/26; H04R 2430/01; H04S 2400/13
USPC ................... 381/104, 107, 100; 704/224, 223
See application file for complete search history.

(56) References Cited

U.S. PATENT DOCUMENTS

| 5,172,358 | A |  | 12/1992 | Kimura |  |
| 8,019,095 | B2 |  | 9/2011 | Seefeldt |  |
| 2004/0044525 | A1 | * | 3/2004 | Vinton et al. | 704/224 |
| 2007/0092089 | A1 | * | 4/2007 | Seefeldt et al. | 381/104 |
| 2007/0291959 | A1 |  | 12/2007 | Seefeldt |  |
| 2009/0220109 | A1 |  | 9/2009 | Crockett |  |
| 2009/0290727 | A1 |  | 11/2009 | Seefeldt |  |

(Continued)

FOREIGN PATENT DOCUMENTS

| WO | 2010/126709 | 11/2010 |
| WO | 2010/127024 | 11/2010 |

*Primary Examiner* — Vivian Chin
*Assistant Examiner* — Ammar Hamid

(57) ABSTRACT

The loudness of an audio signal is adjusted while reducing changes in its perceived spectral balance, using a dynamically-controllable filter having a high-frequency response characteristic and a low-frequency response characteristic, controlled by dynamically-changing information on the desired gain in each of a plurality of frequency bands of the audio signal.

7 Claims, 6 Drawing Sheets

(56) References Cited

U.S. PATENT DOCUMENTS

| | | |
|---|---|---|
| 2010/0174540 A1 | 7/2010 | Seefeldt |
| 2010/0198377 A1 | 8/2010 | Seefeldt |
| 2011/0009987 A1 | 1/2011 | Gundry |

* cited by examiner

ADJUSTING THE LOUDNESS OF AN AUDIO SIGNAL WITH PERCEIVED SPECTRAL BALANCE PRESERVATION

CROSS-REFERENCE TO RELATED APPLICATIONS

This application claims priority to U.S. Provisional Patent Application No. 61/176,084 filed 6 May 2009, hereby incorporated by reference in its entirety.

BACKGROUND OF THE INVENTION

The invention relates to audio signal processing, namely, to a low-complexity method or apparatus for adjusting the loudness of an audio signal in such a way as to preserve the perceived spectral balance of the audio signal. The invention also relates to a computer program, stored on a computer-readable medium, for causing a computer to perform the method. It also relates to a computer-readable medium storing thereon a computer program performing the method.

SUMMARY OF THE INVENTION

In accordance with aspects of the present invention, the loudness of an audio signal is adjusted while reducing changes in its perceived spectral balance, by applying the audio signal to a dynamically-controllable filter having a high-frequency response characteristic and a low-frequency response characteristic, receiving dynamically-changing information as to the desired gain in each of a plurality of frequency bands of the audio signal that, when applied to the audio signal, tends to preserve perceived spectral balance as the loudness of the audio signal is varied, the information being in response to the audio signal and a desired loudness, wherein there are three or more frequency bands in juxtaposition with one another including an anchor band generally between the lower end of the frequency range in which the high-frequency response characteristic varies and the upper end of the frequency range in which the low-frequency response characteristic varies, a top band at the upper end of the frequency range in which the filter's response varies, and at least one band between the anchor band and the top band, and dynamically controlling the filter in response to the information, wherein the high-frequency response characteristic may be a variable shelf filter response and the low-frequency response characteristic may be a variable-slope response that has a boost/attenuation in the logarithmic domain that reduces monotonically below the anchor band, the variable shelf filter response being controlled in response to the desired gain in each of the three or more frequency bands and the variable-slope response being controlled in response to the desired gain in the anchor band.

The number of bands in the frequency range that includes the anchor band and the top band may be fewer than the number of the human ear's critical bands in that frequency range.

The desired gain in each band may be obtained by analyzing the input signal over a frequency range wider than that of the respective band. The desired gain in the anchor band is obtained by analyzing the input signal over a frequency range that includes frequencies between 500 kHz and 2 kHz.

The cutoff frequency of the variable shelf filter response may be responsive to the level of the audio signal with respect to a threshold of hearing.

The anchor band may be about 700 Hz to about 2 kHz.

FIG. 1 is a schematic functional block diagram showing an example of a method or an apparatus for adjusting the loudness of an audio signal in such a way as to preserve the perceived spectral balance of the audio signal, in accordance with aspects of the present invention. In other words, the task of this apparatus or method is to alter an Audio Input signal to produce an Audio Output signal, such that a listener perceives the loudness of the Audio Output signal to be increased or decreased relative to the loudness of the Audio Input signal, the difference in perceived loudness being equal to a Loudness Change input, while perceiving little or no change in the spectral balance of the audio signal. The Loudness Change input may be static, such as, for example, may result from a volume control level chosen by a user, or it may be dynamic, such as may result, for example, from an automatic leveler apparatus or a process that receives the Audio Output and/or the Audio Input along with a desired Audio Output volume control level chosen by a user. For convenience, the Loudness Change may be expressed, for example, as a ratio (Output Loudness (in Sones) divided by Input Loudness (in Sones)), or on a logarithmic scale. For the remainder of this document, Loudness Change is expressed as a ratio, so that when Loudness Change=1.0, the method or apparatus of the FIG. 1 example ideally has no effect on the audio signal being processed (so, the Audio Output signal has the same loudness as the Audio Input signal, except for a possible delay, which may be ignored). When Loudness Change=2.0, the method or apparatus of the FIG. 1 example ideally boosts the Audio Output, relative to the Audio Input, in such a way that the perceived loudness is doubled (on a Sone scale). Similarly, when Loudness Change=0.5, the method or apparatus of the FIG. 1 example ideally cuts or attenuates the Audio Output, relative to the Audio Input, in such a way that the perceived loudness is halved (on a Sone scale).

The Audio Input is applied to a signal path and to a control path. The signal path may include first and second series-connected filters or filter functions ("Low-Frequency Filter") 2 and ("High-Frequency Filter") 4. Preferably, one of the filters or filter functions operates at low frequencies (frequencies generally below an "Anchor Band", as discussed below) and the other filter or function operates at high frequencies (frequencies generally above the Anchor Band). Although they may be arranged in either order, Low Frequency Filter 2 is shown first in the signal path. Further details of the filters or filter functions are discussed below. The signal path includes a variable gain element 6, shown as a multiplier element or function in the Low-Frequency Filter 2 of the FIG. 1 example. Such a multiplier element or function need not be a part of Filter 2, but may be a part of Filter 4 or may not be a part of either Filter 2 or Filter 4.

In the control path of the FIG. 1 example, a "Compute Gains per Band" device or function 8 receives the Audio Input and the above-mentioned Loudness Change. In this example, device or function 8 outputs a desired gain ("Band Gain") for each frequency band in a set of frequency bands of the Audio Input signal such that, if applied to the Audio Input signal, would preserve or tend to preserve the perceived spectral balance of the Audio Input signal as the loudness of the Audio Input signal is varied to produce the Audio Output signal. This may be achieved, at least in part, by basing the gain calculations of device or function 8 on human-auditory-based frequency-dependent relationships between sound pressure level (SPL) and loudness such as shown in FIG. 10 herein. FIG. 10 is discussed further below.

Control signals for controlling the Low Frequency Filter 2 and the High-Frequency Filter 4 in such a way as to obtain the desired Band Gains to be applied to the Audio Input signal (so as to produce the Audio Output signal) may be obtained from the Band Gains outputs of Compute Gains per Band 8 by a low-frequency filter control or controller process ("LF Control") 10 and a high-frequency filter control or controller process ("HF Control") 12. The LF Control 10 derives three control variables, including a gain factor G, from the Anchor Band gain. The HF Control 12 derives five control variables from the Anchor Band gain and the respective gains of at least two high-frequency bands. The number of control variables used to control the LF and HF filters may differ in alternative embodiments, inasmuch as alternative filter structures may require a different number of variable coefficients.

Aspects of the present invention include the recognition that a variable-loudness spectral-balance-preserving Audio Output signal may be obtained by approximating a complex ideal filter response with the response of simple low frequency and high frequency filter characteristics and by employing as few as three Band Gains, one for the Anchor Band and two or more for frequency bands higher than the Anchor Band, for controlling the simple filter characteristics. For example, FIG. 2 shows a log gain (dB) versus log frequency plot of a set of eighteen Band Gain values (plotted as small circles), which may be assumed to be a desired filter response, and a smoothed filter curve that is intended to approximate the eighteen Band Gain values. A value for a frequency in the Anchor Band is highlighted as a solid black circle, and a "Top Band" frequency value is highlighted with a cross. FIG. 3 shows a reduced set of Band Gain values (relative to the example of FIG. 2) that may be used, in accordance with aspects of the present invention, to approximate a smoothed filter curve based on the larger number of Band Gain values. The behavior of the filter may be split into two parts—the frequencies below the Anchor Band and the frequencies above the Anchor Band. By adopting low-frequency filter responses such as in the FIG. 4 example in which the response below the Anchor Band is determined by the Anchor Band value, none of the Band Gain values below the Anchor Band are required. By adopting high-frequency shelf filter responses such as in the FIG. 5 example, a set of two (shown) to five Band Gain values above the Anchor Band frequency are all that is required to approximate a smoothed filter curve based on the larger number of Band Gain values. Thus, a complicated response that one might expect to need in maintaining a perceived spectrum when the loudness is changed may be approximated by two very simple filter characteristics, one operating at low frequencies and the other at high frequencies. This results in a substantial simplification relative to attempting to generate the required response on, for example, a critical band basis that may require 20 to 40 bands. A further reduction in complexity is obtained in that the analysis required to control the simple filter response, which again might have been expected to require a large number of bands, for example critical bands, may instead employ a small number of wide bands.

Anchor Band

In an exemplary embodiment employing five bands, the Band Gain values may correspond to the desired gain at the following frequencies:

$BandF_{Hz}(1)$=1 kHz (the Anchor Band)
$BandF_{Hz}(2)$=5 kHz
$BandF_{Hz}(3)$=9 kHz
$BandF_{Hz}(4)$=13 kHz
$BandF_{Hz}(5)$=17 kHz (the High Frequency Band)

The $BandFHz(i)$ frequencies may refer to a substantially center frequency, or a representative frequency, for each band. For example, the Band Gain of the 2nd band (Band Gain(2)) may refer to the desired gain that ideally should be applied by the combination of the Low-Frequency Filter 2 and High-Frequency Filter 4 filter at 5 kHz. It will be appreciated that the gain of the low and high frequency filter combination in the frequency range from 3000 Hz to 7000 Hz may be approximately equal to Band Gain(2). The Band Gain value for the 2nd band may be derived from analysis of the input audio signal over a wider frequency range, with most weight given to frequencies between 1000 Hz and 9000 Hz, for example. In this analysis process, the signal power (in the 1000 to 9000 Hz band) may be used as an estimate of the Sound Pressure Level, and the desired loudness change may be applied according to the process described below in connection with FIG. 11.

The Band Gain(1) value may have the following attributes:
Band Gain(1) refers to the desired gain at 1 kHz.
Band Gain(1) is the Anchor Gain because band 1 is the Anchor Band, and the Anchor Band frequency is 1 kHz in this example.
The filter gain that is applied between 700 Hz to 2 kHz should be approximately equal to Band Gain(1).
Below 700 Hz, the filter's response varies as a function of Band Gain(1), as shown in FIG. 4, namely, above the anchor band, the filter has a flat frequency response and below the anchor band it has a variable-slope response that has a boost/attenuation in the logarithmic domain that reduces monotonically below the anchor band.
The Band Gain(1) gain may be computed based on analysis of the input signal over a frequency range from approximately 300 Hz to 4 kHz. The lower limit of this frequency range may be determined by a high-pass filter with a cut-off frequency of 400 Hz, for example, but which may have a cut-off frequency in the range of 100 Hz to 1000 Hz. Alternatively, the high-pass filter may be omitted, so that the Band Gain(1) gain is computed based on analysis of the input signal over the frequency range from 0 Hz to 4 kHz.

High Frequency Band

The High Frequency Band is the band that corresponds to the highest frequency of interest in the filter. In the example bands listed above, BandFHz(5)=17 kHz, so that this band is intended to define the desired filter response over the range from 14 kHz to 20 kHz. This frequency is chosen so that the upper extremity of the band (20 kHz) is approximately equal to the upper limit of human audio perception (20 kHz), or the upper frequency limit of the audio system (which is generally limited by the sample-rate of the system). For example, the upper band center frequency of 17 kHz may be appropriate for audio systems operating at a sample rate of 44.1 kHz, 48 kHz, or 96 kHz, but an upper band frequency of 12 kHz may be appropriate in an audio system that is operating with a 32 kHz sample rate.

It will be appreciated that the frequency values relating to the various bands, including the Anchor Band and High Frequency Band are useful examples, but are not critical to the invention.

DETAILED DESCRIPTION OF THE INVENTION

Low Frequency Filter Details

Figure 4:
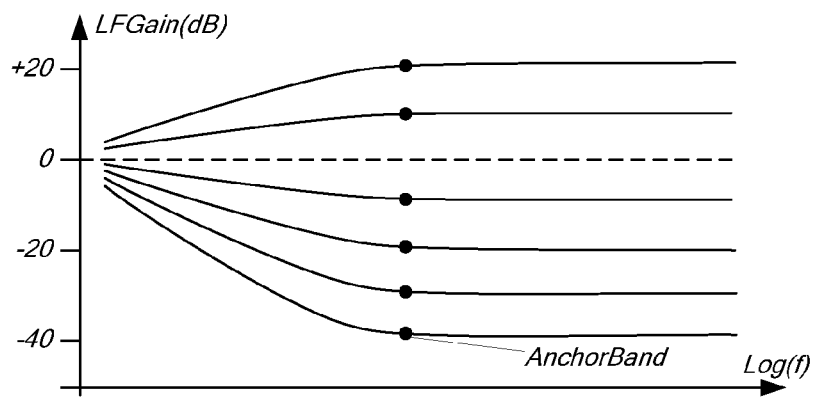
FIG. 4 shows representative examples of a family of low-frequency filter responses in which the response below the Anchor Band is determined only by the Anchor Band value.

The behavior of the Low-Frequency Filter 2 is determined solely by the Band Gain value at the Anchor Band frequency, as shown in FIG. 4. FIG. 4 shows a series of Low-Frequency Filter 2 idealized filter response curves (log gain in dB versus log frequency) for various Anchor Band gain levels. As various gain levels are applied at the Anchor Band frequency, lower frequency bands are boosted or attenuated by a lesser amount than the applied gain level. Above the anchor band, the filter has a flat frequency response and below the anchor band it has a variable-slope response that has a boost/attenuation in the logarithmic domain that reduces monotonically below the anchor band. This monotonic reduction of the low frequency gain adjustment may be expressed in the following Equation:

$$LFGain(f) = \frac{AnchorGain}{2} \times \qquad (1.1)$$

$$\left[ \min\left(1, \frac{f}{1.02(f+20)}\right) + \max\left(0.1, \min\left(0, \frac{\log_2\left(\frac{f}{700}\right)}{10}\right) + 1\right) \right]$$

In Equation 1.1, the Anchor Band gain and LFGain(f) values are both expressed on a logarithmic gain scale (such as dB). Although this equation represents a desired frequency response, a practical implementation may provide an approximation to this response. One possible method of implementation is shown in FIG. 1.

Figure 1:
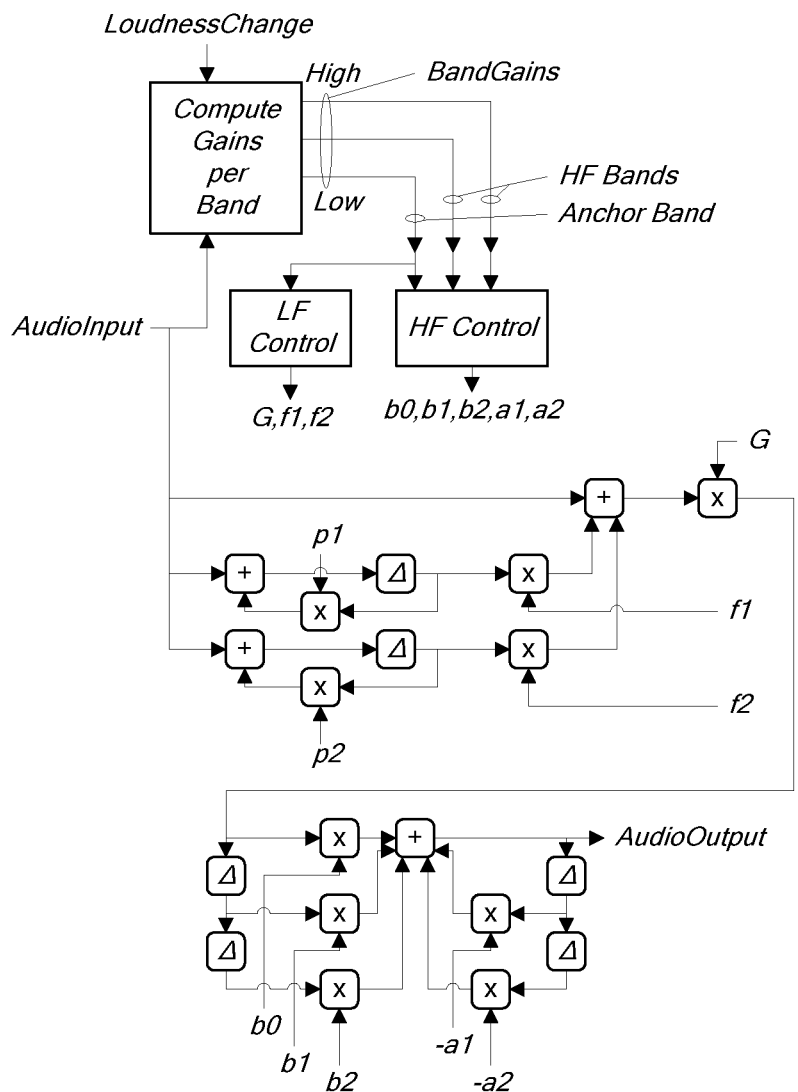
FIG. 1 is a schematic functional block diagram showing an example of a method or an apparatus for adjusting the loudness of an audio signal in such a way as to preserve the perceived spectral balance of the audio signal, in accordance with aspects of the present invention.

In the example of FIG. 1, the Low Frequency Filter 2 uses a pair of fixed 1st order filters (defined by the feedback structures with poles p1 and p2, respectively) and three gain factors, G, f1 and f2, in order to approximate the curves shown in FIG. 4. Given Anchor Band gain (in dB), one may determine the coefficients of the filter structure as follows:

$$p_1 = 0.9960806996745 \qquad (1.2)$$
$$p_2 = 0.9614814515953$$
$$G = 10^{\left(\frac{AnchorGain}{20}\right)}$$
$$f_1 = -0.0212709\left(\frac{AnchorGain}{320\log_{10}(2)}\right) +$$
$$0.0872445\left(\frac{AnchorGain}{320\log_{10}(2)}\right)^2 - 0.0930398\left(\frac{AnchorGain}{320\log_{10}(2)}\right)^3$$
$$f_2 = -0.0787286\left(\frac{AnchorGain}{320\log_{10}(2)}\right) - 0.0851808\left(\frac{AnchorGain}{320\log_{10}(2)}\right)^2 +$$
$$0.1620663\left(\frac{AnchorGain}{320\log_{10}(2)}\right)^3$$

Figure 6:
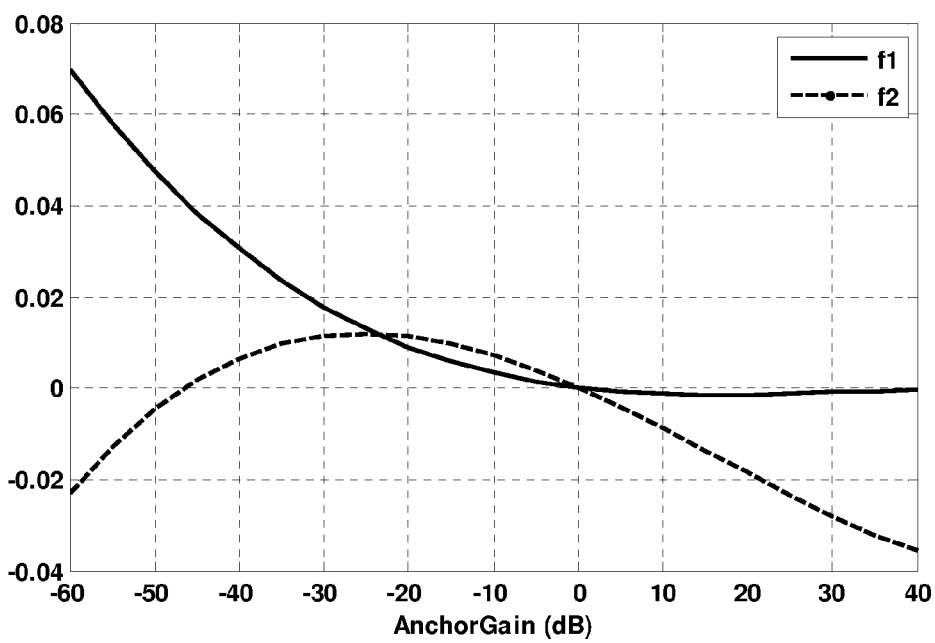
FIG. 6 show plots of the f1 and f2 polynomial values of equation 1.2.

Equations 1.2 provide fixed values for the poles of the LF Filter 2. The gain, G, is computed by converting the Anchor Band gain (in dB) into a linear gain value. The f1 and f2 coefficients are computed by a pair of polynomials that have been derived by an optimization process, to provide a suitable match to the desired frequency response curves. These polynomials provide a reasonable match to the desired curves for Anchor Band gain values between −60 and +40 dB. The f1 and f2 polynomials are plotted in FIG. 6. In equation 1.2, the $p_1$ and $p_2$ coefficients may be expressed with four or five decimal places. The other coefficients may be expressed with four decimal places.

High Frequency Filter Details

Figure 5:
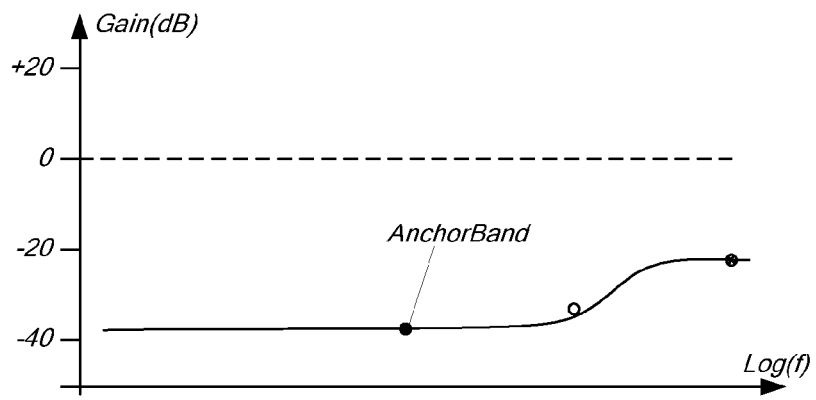
FIG. 5 is a representative example of one of a family of high-frequency shelf filter responses in which a set of two (shown) to five Band Gain values above the Anchor Band frequency approximate a smoothed filter curve based on the larger number of Band Gain values. This example differs from the example of FIG. 3 in that the FIG. 3 example shows a combined high-frequency and low-frequency filter response, whereas, the FIG. 5 example shows only the high-frequency filter response.

In the high frequency range, the behavior of the High-Frequency Filter 4 may be determined by Band Gain values such as shown in FIG. 5.

Figure 2:
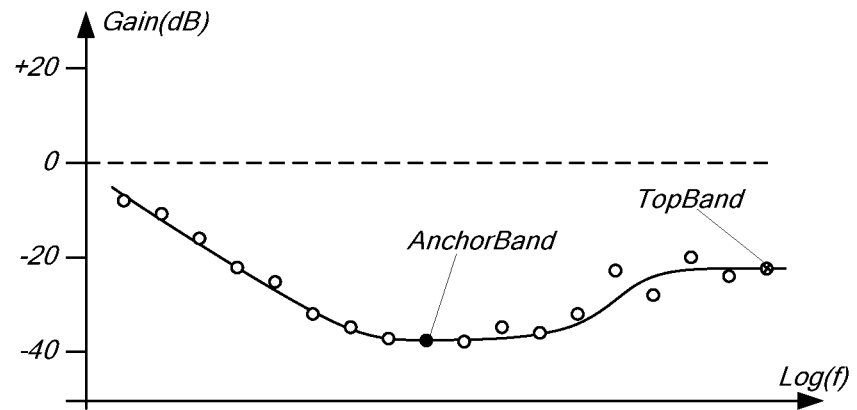
FIG. 2 shows an log gain (dB) versus log frequency plot of a set of eighteen Band Gain values (plotted as small circles), which may be assumed to be a desired filter response, and a smoothed filter curve that is intended to approximate the eighteen Band Gain values.
Figure 3:
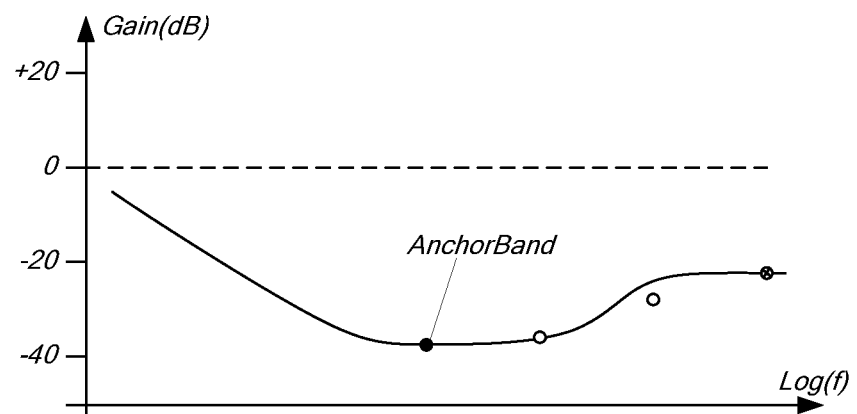
FIG. 3 shows a reduced set of Band Gain values (relative to the example of FIG. 2) that may be used, in accordance with aspects of the present invention, to approximate a smoothed filter curve based on a larger number of Band Gain values.

Unlike the Low-Frequency Filter 2 characteristics, the High-Frequency Filter 4 characteristics preferably are determined from a larger set of parameters. As previously described, the Low-Frequency Filter 2 characteristics are entirely determined by the gain at the Anchor Band frequency (see FIG. 2) However, the High Frequency Filter 4 preferably is implemented by a shelf filter that has the following properties:
1. The shelf filter's response at the Anchor Band ideally matches the desired Anchor Band gain.
2. At high frequencies (above the Anchor Band), the gain of the shelf response ideally is constrained between 0 dB and the Anchor Band gain.

3. The transition frequency of the shelf filter is higher than the Anchor Band frequency.

Figure 7:
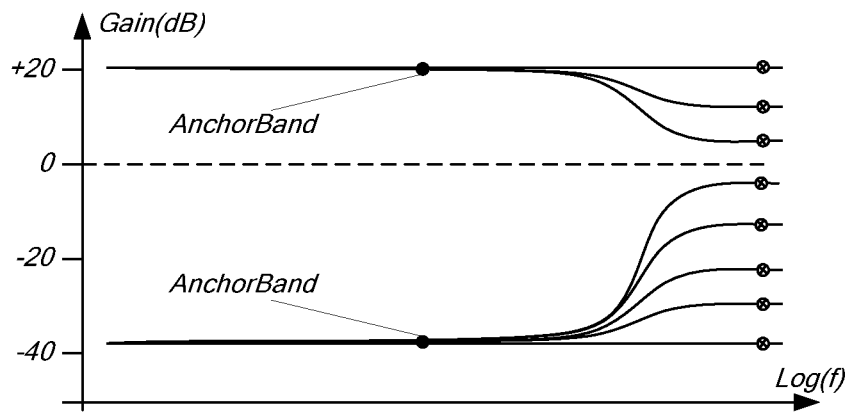
FIG. 7 shows instructive examples of idealized high-frequency shelf filter responses.

FIG. 7 shows useful shelf filter gain profiles (ignoring any possible variation in transition frequency). Note that the shelf filter frequency response curve does not cross the 0 dB line, and the gain at high frequencies is always constrained to lie between the Anchor Band gain and 0 dB.

Figure 8:
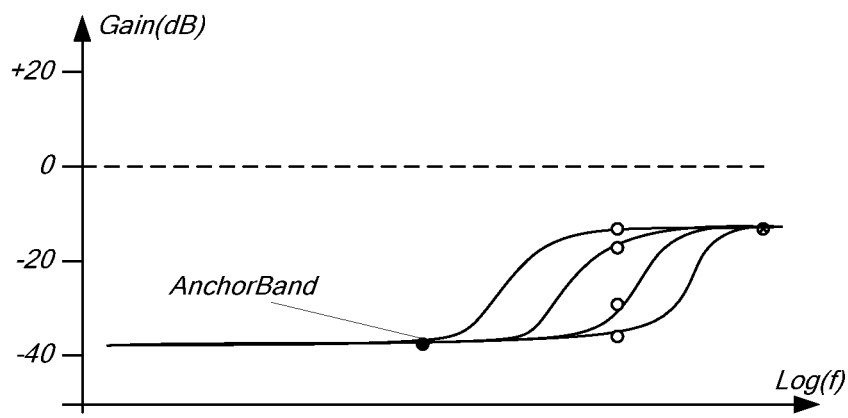
FIG. 8 shows further instructive examples of idealized high-frequency shelf filter responses.

FIG. 8 shows how the transition frequency of the shelf may vary, as a function of the intermediate Band Gain values (the gains in the Bands between the Anchor Band and the highest Band). Only one Band Gain value is shown in FIG. 8, but there may be more than one. The transition frequency of the shelf (the frequency at which the gain is midway between the low frequency gain and the high frequency gain) is adjusted (dynamically) as shown in FIG. 8. Ideally, the cutoff frequency is moved in response to the audio level with respect to the Threshold of Hearing in the band or bands above the Anchor Band.

The process of determining the desired shelf-filter characteristics may operate as follows. One may define a 2nd order shelf filter in terms of its low-frequency gain (in dB), its high-frequency gain (in dB), and the shelf transition frequency (in Hz). These quantities may be referred to herein as ShelfGainLo, ShelfGainHi and ShelfFHz. The procedure may be expressed as follows:

1. Define a clip( ) function as follows:

$$\text{clip}(x, a, b) = \begin{cases} \max(a, b) & \{x > \max(a, b)\} \\ x & \{\min(a, b) \le x \le \max(a, b)\} \\ \min(a, b) & \{x < \min(a, b)\} \end{cases}$$

2. Sort a set of Band Gain values in order of increasing frequency:

BandGain($i$):$i$=1 . . . NoBands, where Band Gain(1) is the Anchor Band gain (Anchor Band gain), and Band Gain(NoBands) is the gain of the Top Band (indicated by the circle with a cross in FIG. 5).

Band Gain(i) represents the desired filter gain at frequency BandFHz(i), and one may rely on the simplifying assumption that these BandFHz(i) values form an arithmetic progression (i.e. they are evenly spaced on a linear frequency scale).

3. Compute:

ShelfGain$_{Lo}$=BandGain(1)

ShelfGain$_{Hi}$=clip(BandGain(NoBands),BandGain(1), 0)

or, alternatively:

ShelfGain$_{Lo}$=BandGain(1)

ShelfGain$_{Hi}$=clip(BandGain(NoBands),BandGain(1), α×BandGain(1))

Where α is typically in the range [0 . . . ½]

4. Compute (for b=2 . . . NoBands-1):

$$\text{NormBand}(b) = \text{clip}\left(\frac{\text{ShelfGain}_{Hi} - \text{BandGain}(b)}{\text{ShelfGain}_{Hi} - \text{ShelfGain}_{Lo}}, 0, 1\right)$$

$$\text{ShelfF}_{rel} = \sum_{b=2}^{\text{NoBands}-1} \text{NormBand}(b)$$

5. And finally, compute:

$$\text{Shelf}_{Hz} = \text{BandF}_{Hz}(1) + (\text{BandF}_{Hz}(\text{NoBands}) - \text{BandF}_{Hz}(1))\frac{\text{ShelfF}_{rel} + \frac{1}{2}}{\text{NoBands} - 1}$$

In Step 3, one may use the Anchor Band gain and the TopBand gain as the low- and high-frequency shelf gains, respectively.

Figure 9:
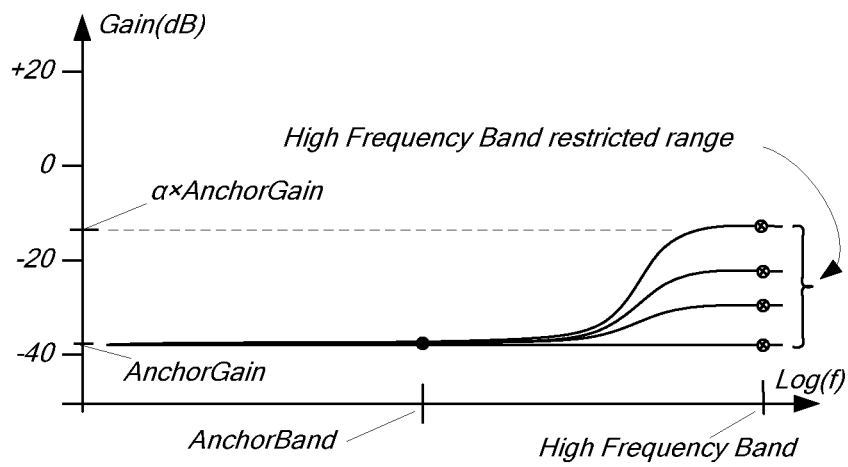
FIG. 9 shows yet further instructive examples of idealized high-frequency shelf filter responses.

The constant, α, introduced in Step 3 is intended to provide a limit to the shelf filter's high frequency gain as shown in FIG. 9. In this example, the Anchor Gain is negative (in dB). As a result, the high frequency gain of the shelf filter is also restricted to negative, and furthermore it is restricted to always lie between the Anchor Gain and α times the Anchor Gain. A typical value for "α" is 0.3 or 0.4, but any value between 0 and 0.7 may be useful.

In Step 4, one may normalize the gains of the intermediate bands (those bands between the Anchor Band and the Top Band), and clip them to lie in the range 0.1. Hence, NormBand(b)=1 indicates that this band has a gain equal to the Anchor Band gain, and NormBand(b)=0 indicates that this band has a gain equal to the TopGain.

When one sums all of the NormBand(b) values together, the end result is ShelfFrel which has a value between 0 and (NoBands-2), where ShelfFrel=0 indicates that the shelf filter should have a transition frequency at the low end of the frequency range, and ShelfFrel=(NoBands-2) indicates that the shelf filter should have a transition frequency at the high end of the frequency range.

Step 5 converts ShelfFrel to Hz.

Once one has computed ShelfGainLo, ShelfGainHi and ShelfFHz, the shelf filter may then be designed using any of various known techniques. For example, the High-Frequency Filter 4 may be implemented with biquad filter structure, constituting a $2^{nd}$ order IIR filter, such as shown in FIG. 1.

The coefficients for this biquad may be computed via MATLAB code shown below (MATLAB is a computer tool widely used in the audio arts and is a trademark of The MathWorks, Inc.):

```
% Matlab code to compute biquad filter coefficients for a shelf filter
% Given :  Shelf_FC     (the shelf transition frequency (Hz))
%          FSample      (the sample rate of the DSP system (Hz))
%          ShelfGainLo  (the gain at the Anchor Band (dB))
%          ShelfGainHi  (the gain at FSample/2 (dB))
Shelf_Gain_LF = 0;
Shelf_Gain_HF = ShelfGainHi − ShelfGainLo;
z0=(−1+i)/sqrt(2)*2*pi*Shelf_FC* (10 .^
( (Shelf_Gain_LF−Shelf_Gain_HF)/4 / 20));
p0=(−1+i)/sqrt(2)*2*pi*Shelf_FC* (10 .^
( −(Shelf_Gain_LF−Shelf_Gain_HF)/4 / 20));
K =                    (10 .^ ( Shelf_Gain_HF / 20));
[z,p,k]=bilinear([z0;conj(z0)],[p0;conj(p0)],K,FSample,Shelf_FC);
[B,A]=zp2tf(z,p,k);
b0 = B(1);
b1 = B(2);
b2 = B(3);
a1 = A(2);
a2 = A(3);
```

The above script makes use some inbuilt Matlab functions, including bilinear( )) and zp2tp( ) These functions are documented by Mathworks, and are well known in the art.

Operating Principles

Figure 10:
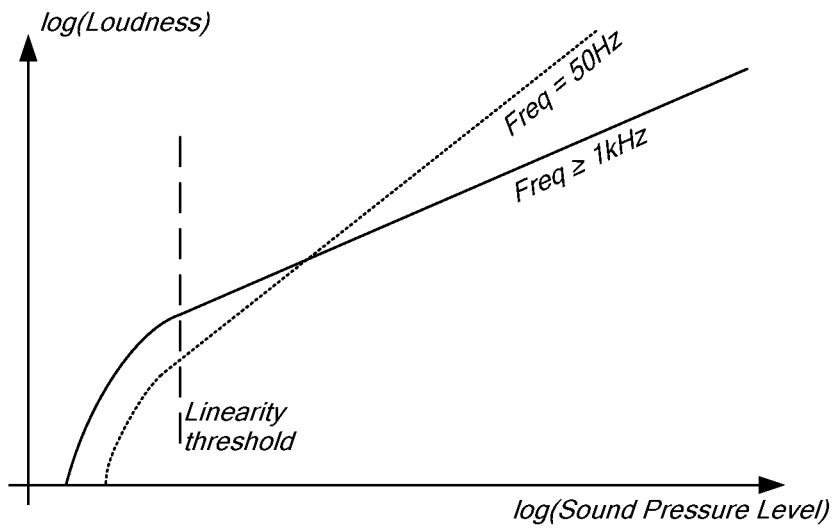
FIG. 10 shows non-linear gain-to-loudness function responses based on the human auditory system suitable for use according to aspects of the present invention.

The example of FIG. 1 operates to preserve the perceived spectral balance in the processed audio by employing, in the Compute Gains per Band 8 of FIG. 1, non-linear gain-to-loudness functions based on the human auditory system, such as shown in FIG. 10. The plot in FIG. 10 shows that there is a substantially linear relationship between the logarithm of Loudness and the logarithm of Sound Pressure Level, provided that the Amplitude is above the Linearity Threshold. Below this Linearity Threshold, loudness drops off more rapidly as the audio Sound Pressure Level approaches and then falls below the Threshold of Hearing, which is the point where the slope of the Sound Pressure Level to Loudness curve approaches vertical.

Figure 11:
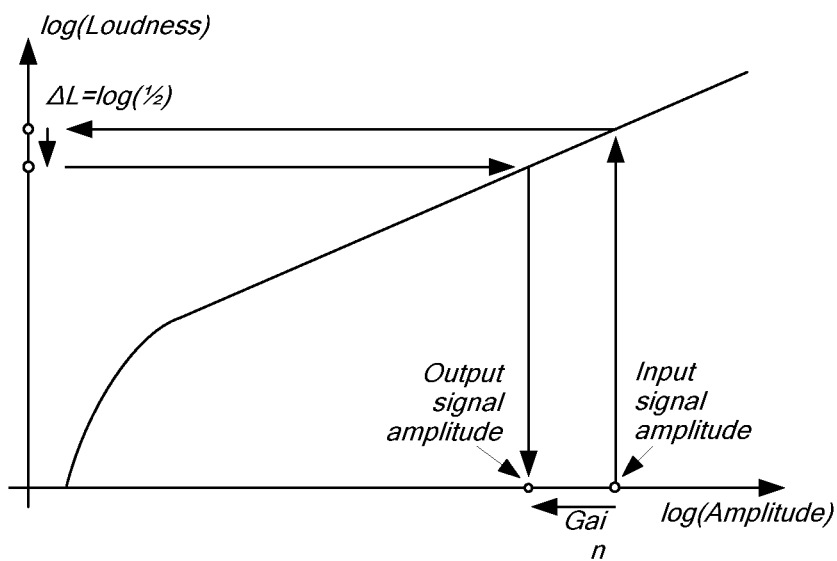
FIG. 11 shows an example of the manner in which non-linear gain-to-loudness function responses may be employed.

In order to modify the perceived loudness of an audio signal (by a prescribed loudness ratio), one may represent this as a prescribed shift up or down on the log(Loudness) axis of FIG. 10. For example, if one wishes to halve the loudness of a 1 kHz signal, one may apply the process shown in FIG. 11. The process operates as follows:

1. Measure the amplitude of the input signal (for example, rms amplitude) in one frequency band (for example, a band of frequencies centered around 1 kHz), and mark this amplitude on the horizontal axis (Input Signal Amplitude)
2. Using the amplitude-to-loudness curve of FIG. 8, convert this amplitude to a corresponding loudness value on the vertical axis.
3. Add/subtract the desired loudness change ($\Delta L = \log(0.5)$) to compute the desired Output Loudness (for this frequency band).
4. Convert this Desired Output Loudness back to amplitude, to compute a desired Output Signal Amplitude.
5. The difference between the Input Signal Amplitude and the Output Signal Amplitude is the Gain that one needs to apply to this audio band in order to modify its loudness by the desired $\Delta L$.

If the amplitude of the Audio Input and Audio Output signals are sufficiently loud (above the Linearity Threshold) in all frequency bands, then the linear nature of the amplitude-loudness curve means that:

$$\text{Gain} = \alpha_n \times \Delta L. \quad (1.3)$$

The scale factor, $a_n$, is the Nominal Loudness to Gain scale factor and is generally equal to 1.7, for signals at or above 1 kHz. This is a ratio of logarithmic quantities (it converts log(Loudness) to log(Gain)). Thus, in order to multiply loudness by 2, one requires a gain of $2^{1.7} \approx 3.25$ (about 10 dB).

For lower frequency signals, the Loudness to Gain scale factor is lower (because the slope of the amplitude-loudness curve is steeper for lower frequencies (see FIG. 10, which shows the amplitude-loudness curve for 50 Hz). For example, for loud signals at 50 Hz, the gain required to modify their loudness by a prescribed amount is only a fraction of the gain that would be required at 1 kHz.

The reduction in log(Gain) applied at low frequencies may be designated "LFGainFactor". Thus, at frequencies below 1 kHz, one may use the following equation:

$$\text{Gain}_{LF}(f) = \text{LFGainFactor}(f) \Delta \alpha_n \times \Delta L \quad (1.4)$$

One should also be aware of the non-linear fall-off of the amplitude-loudness curves at low amplitude levels (the region below the Linearity Threshold in FIG. 10). In the low-amplitude region of the curve, where the slope of the curve is steeper, small gain factors can have a large impact on the loudness of the audio signal, so the prescribed loudness change may therefore be achieved with a relatively small gain change. Hence, in regions of the spectrum where the audio signal is very low in amplitude, the gain factor may be reduced (that is, made closer to 0 dB). This tends to happen mostly at high frequencies, where the energy of the audio signal may be very low.

Figure 12:
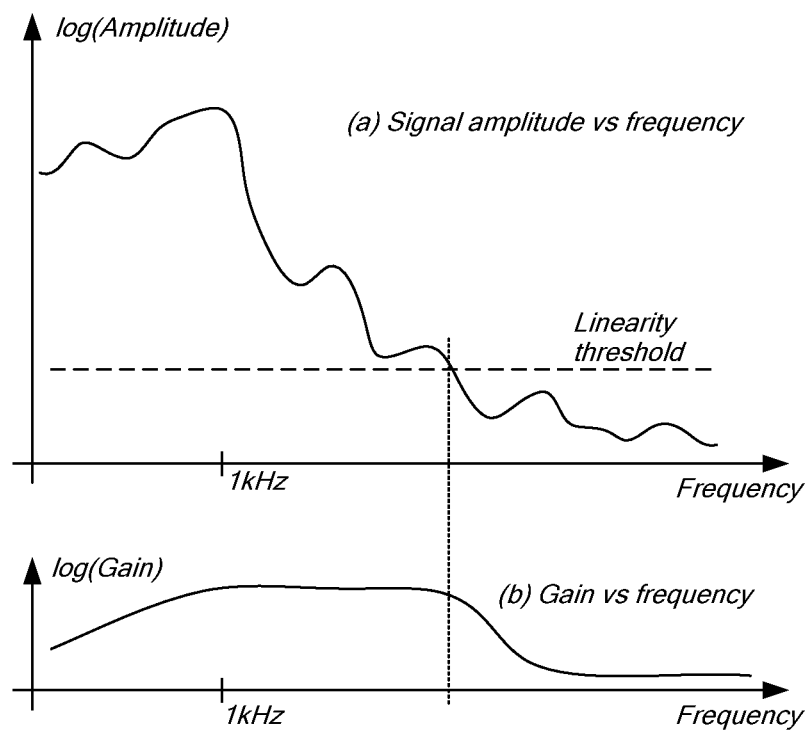
FIG. 12, in its upper portion, shows an exemplary signal amplitude (log scale) versus frequency, in which the amplitude of higher-frequency components of the audio tend to fall away to very low levels. The lower portion of FIG. 12 shows a resulting gain profile in which the high-frequency portion takes on a shelf-filter shape and the gain at lower frequencies ramps down toward zero (on a logarithmic scale).

If one looks at the spectrum of a typical audio signal (with the spectrum plotted in terms of energy per octave), one typically sees very low signal levels in the high frequencies. As a result, the gain applied at these higher frequencies (where the amplitude has fallen below the Linearity Threshold) reduces to 1 (i.e., the log(Gain) reduces to zero). FIG. 12 illustrates this principal showing a typical audio spectrum and the associated Gain profile (for a prescribed boost in loudness).

As shown in the upper portion of FIG. 12, the amplitude of higher-frequency components of the audio tends to fall away to very low levels in an almost monotonic fashion. This is typical of many audio signals. As a result, the high-frequency gain profile, as seen in the lower portion of FIG. 12, commonly takes on a shelf-filter shape. Note also in FIG. 12, the gain at lower frequencies ramps down toward zero (on a logarithmic scale), because of the LFGainFactor.

Implementation

The invention may be implemented in hardware or software, or a combination of both (e.g., programmable logic arrays). Unless otherwise specified, the algorithms included as part of the invention are not inherently related to any particular computer or other apparatus. In particular, various general-purpose machines may be used with programs written in accordance with the teachings herein, or it may be more convenient to construct more specialized apparatus (e.g., integrated circuits) to perform the required method steps. Thus, the invention may be implemented in one or more computer programs executing on one or more programmable computer systems each comprising at least one processor, at least one data storage system (including volatile and non-volatile memory and/or storage elements), at least one input device or port, and at least one output device or port. Program code is applied to input data to perform the functions described herein and generate output information. The output information is applied to one or more output devices, in known fashion.

Each such program may be implemented in any desired computer language (including machine, assembly, or high level procedural, logical, or object oriented programming languages) to communicate with a computer system. In any case, the language may be a compiled or interpreted language.

Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

A number of embodiments of the invention have been described. Nevertheless, it will be understood that various modifications may be made without departing from the spirit and scope of the invention. For example, some of the steps described herein may be order independent, and thus can be performed in an order different from that described.

The invention claimed is:

1. A method for adjusting the loudness of an audio signal while reducing changes in its perceived spectral balance, comprising applying the audio signal to a dynamically-controllable filter having a high-frequency response characteristic and a low-frequency response characteristic, receiving dynamically-changing information as to the desired gain in each of three or more frequency bands of the audio signal which desired gain, when applied to the audio signal, tends to preserve perceived spectral balance as the loudness of the audio signal is varied, the information being in response to the audio signal and a desired loudness, wherein the three or more frequency bands are in juxtaposition with one another including an anchor band generally between the lower end of the frequency range in which the high-frequency response characteristic varies and the upper end of the frequency range in which the low-frequency response characteristic varies, a top band at the upper end of the frequency range in which the filter's controllable high frequency response characteristic varies, and at least one band between the anchor band and the top band, and dynamically controlling said filter in response to said information, wherein the high-frequency response characteristic is a variable shelf filter response and the low-frequency response characteristic is a variable-slope response that has a boost/attenuation, the variable shelf filter response being controlled in response to the desired gain in each of said three or more frequency bands and the variable-slope response being controlled in response to the desired gain in said anchor band.

2. A method according to claim 1 wherein the desired gain in each band is obtained by analyzing the input signal over a frequency range wider than that of the respective band.

3. A method according to claim 1 wherein the cutoff frequency of the variable shelf filter response is responsive to the level of the audio signal with respect to a threshold of hearing.

4. A method according to claim 1 wherein said anchor band is about 700 Hz to about 2 kHz.

5. A method according to claim 1 wherein the desired gain in the anchor band is obtained by analyzing the input signal over a frequency range that includes frequencies between 500 Hz and 2 kHz.

6. A computer program, stored on a non-transitory computer-readable medium, for causing a computer to perform the method of claim 1.

7. A non-transitory computer-readable medium storing thereon the computer program performing the method of claim 1.

* * * * *